(12) United States Patent
Zhang et al.

(10) Patent No.: US 11,131,887 B2
(45) Date of Patent: Sep. 28, 2021

(54) DISPLAY APPARATUS, PANEL SWITCHING METHOD AND ELECTRONIC DEVICE

(71) Applicant: MOBVOI INFORMATION TECHNOLOGY COMPANY LIMITED, Beijing (CN)

(72) Inventors: Shihai Zhang, Beijing (CN); Yu Zhou, Beijing (CN); Xiaoli Shi, Beijing (CN); Tieshan Chen, Beijing (CN)

(73) Assignee: MOBVOI INFORMATION TECHNOLOGY COMPANY LIMITED

( * ) Notice: Subject to any disclaimer, the term of this patent is extended or adjusted under 35 U.S.C. 154(b) by 727 days.

(21) Appl. No.: 15/778,949

(22) PCT Filed: Feb. 13, 2018

(86) PCT No.: PCT/CN2018/076727
§ 371 (c)(1),
(2) Date: May 24, 2018

(87) PCT Pub. No.: WO2019/056699
PCT Pub. Date: Mar. 28, 2019

(65) Prior Publication Data
US 2021/0165285 A1 Jun. 3, 2021

(30) Foreign Application Priority Data
Sep. 22, 2017 (CN) .......................... 201710868946.3

(51) Int. Cl.
*G09G 5/00* (2006.01)
*G02F 1/13363* (2006.01)
(Continued)

(52) U.S. Cl.
CPC .. *G02F 1/133638* (2021.01); *G02F 1/133528* (2013.01); *G02F 1/133531* (2021.01);
(Continued)

(58) Field of Classification Search
USPC ...... 345/5, 173, 174, 204, 205, 206; 349/11, 349/103
See application file for complete search history.

(56) References Cited

U.S. PATENT DOCUMENTS

2011/0050545 A1 3/2011 Namm et al.
2013/0016292 A1* 1/2013 Miao ................... G02B 27/283
349/11

(Continued)

FOREIGN PATENT DOCUMENTS

CN   1708196 A   12/2005
CN   1901003 A   1/2007

(Continued)

OTHER PUBLICATIONS

International Search Report dated Jun. 25, 2018; International Patent Application No. PCT/CN2018/076727 filed Feb. 13, 2018. ISA/CN.

(Continued)

*Primary Examiner* — Thuy N Pardo
(74) *Attorney, Agent, or Firm* — McDonald Hopkins LLC

(57) ABSTRACT

The present disclosure provides a display apparatus. The display apparatus includes: an organic light-emitting display panel and a liquid crystal display panel disposed on a light-emitting side of the organic light-emitting display panel. The liquid crystal display panel includes: a wave plate, a linear polarizer, a bottom substrate, a liquid crystal layer and an upper substrate which are stacked successively. The bottom substrate is a transparent substrate. The organic light-emitting display panel includes a metal layer; and the metal layer serves as a backlight source of the liquid crystal display panel.

14 Claims, 6 Drawing Sheets

(51) Int. Cl.
*G02F 1/1335* (2006.01)
*G02F 1/13357* (2006.01)
*G09G 3/3208* (2016.01)
*G09G 3/36* (2006.01)
*H01L 27/32* (2006.01)
*H01L 51/52* (2006.01)
*G06F 3/041* (2006.01)

(52) U.S. Cl.
CPC .. *G02F 1/133555* (2013.01); *G02F 1/133603* (2013.01); *G02F 1/133621* (2013.01); *G09G 3/3208* (2013.01); *G09G 3/36* (2013.01); *H01L 27/3211* (2013.01); *H01L 51/5221* (2013.01); *H01L 51/5284* (2013.01); *G02F 1/133567* (2021.01); *G02F 2201/44* (2013.01); *G02F 2413/01* (2013.01); *G02F 2413/08* (2013.01); *G06F 3/041* (2013.01); *G09G 2300/023* (2013.01); *G09G 2354/00* (2013.01)

(56) References Cited

U.S. PATENT DOCUMENTS

| | | | |
|---|---|---|---|
| 2014/0132898 A1* | 5/2014 | Qin | G02F 1/133536 349/103 |
| 2016/0004137 A1 | 1/2016 | Sagardoyburu | |
| 2016/0034084 A1* | 2/2016 | Tseng | H01L 51/5281 345/173 |
| 2016/0306452 A1* | 10/2016 | Jung | G02F 1/13338 |
| 2017/0038638 A1* | 2/2017 | Park | H01L 51/5281 |
| 2017/0139218 A1* | 5/2017 | Lu | G02F 1/133526 |
| 2017/0193931 A1* | 7/2017 | Han | G09G 3/3674 |
| 2017/0261793 A1* | 9/2017 | Son | G02F 1/133553 |
| 2017/0285360 A1* | 10/2017 | Zha | G02B 30/27 |
| 2017/0372113 A1* | 12/2017 | Zhang | G06K 9/2036 |
| 2018/0004044 A1* | 1/2018 | Nolan | G02F 1/1336 |
| 2018/0233108 A1* | 8/2018 | Zhang | G09G 3/3208 |
| 2019/0278546 A1* | 9/2019 | Cronin | G06F 3/147 |

FOREIGN PATENT DOCUMENTS

| | | |
|---|---|---|
| CN | 101806962 A | 8/2010 |
| CN | 104020602 A | 9/2014 |
| CN | 105974649 A | 9/2016 |
| CN | 106842731 A | 6/2017 |
| CN | 106324877 A | 11/2017 |
| CN | 107515493 A | 12/2017 |
| JP | 2003098983 A | 4/2003 |

OTHER PUBLICATIONS

Extended European Search Report dated May 11, 2021; European Patent Application No. 18723659.1.

* cited by examiner

DISPLAY APPARATUS, PANEL SWITCHING METHOD AND ELECTRONIC DEVICE

CROSS-REFERENCE TO RELATED APPLICATION

This application is a 35 U.S.C. 371 national stage filing of PCT Application No. PCT/CN2018/076727 filed on Feb. 13, 2018, which claims priority to Chinese Patent Application No. 201710868946.3 filed on Sep. 22, 2017, each of which are incorporated herein in their entirety by reference.

TECHNICAL FIELD

Embodiments of the present disclosure relate to the display technical field, and for example, relate to a display apparatus, a panel switching method and an electronic device.

BACKGROUND

An organic light-emitting diode (OLED) is also called as an organic electroluminescence display or organic light-emitting semiconductor. The OLED is widely used for the advantages of self-illumination, wide viewing angle, low power consumption, extremely high reaction speed and the like. A twisted nematic (TN) panel becomes a widely applied entry-level liquid crystal panel for low production cost.

The inventor finds in a research process that the OLED can provide a backlight source for the TN panel when the OLED is used together with the TN panel, but the price is that the OLED loses display contrast and color saturation.

SUMMARY

Embodiments of the present disclosure provide a display apparatus and a terminal capable of ensuring display contrast and color saturation to a certain degree and reducing intensity of reflected stray light when the OLED is used together with the TN panel.

In a first aspect, an embodiment provides a display apparatus. The display apparatus includes: an organic light-emitting display panel and a liquid crystal display panel disposed on a light-emitting side of the organic light-emitting display panel.

The liquid crystal display panel includes: a wave plate, a linear polarizer, a bottom substrate, a liquid crystal layer and an upper substrate which are stacked successively, and the bottom substrate is a transparent substrate.

The organic light-emitting display panel includes a metal layer, and the metal layer serves as a backlight source for the liquid crystal display panel.

Optionally, the wave plate is a ¼ wave plate or a ½ wave plate.

Optionally, the ¼ wave plate comprises an ordinary optical axis and an extraordinary optical axis which are perpendicular to each other, and an included angle between a polarization direction of a linearly polarized light and the ordinary optical axis of the ¼ wave plate satisfies 25°<<40°.

Optionally, the included angle is 37°.

Optionally, the wave plate is bonded with the linear polarizer through a liquid optical adhesive.

Optionally, the organic light-emitting display panel further includes a substrate and a plurality of organic light-emitting structures which are arranged at one side of the substrate and arranged in an array. The organic light-emitting structures include a red organic light-emitting structure, a green organic light-emitting structure and a blue organic light-emitting structure. The organic light-emitting structure is configured to emit red light, the green organic light-emitting structure is configured to emit green light, and the blue organic light-emitting structure is configured to emit blue light.

Optionally, the liquid crystal display panel is a film-compensated super twisted nematic display panel.

Optionally, the liquid crystal display panel further includes a touch functional layer. The touch control functional layer is located at one side of the liquid crystal display panel facing away from the organic light-emitting display panel to realize detection of a touch position.

Optionally, the liquid crystal display panel further includes a protecting cover plate which is located at one side of the touch functional layer facing away from the liquid crystal display panel.

In a second aspect, an embodiment also provides a panel switching method, for the switching control over the above display apparatus. The method includes: turning on the liquid crystal display panel and turning off the organic light-emitting panel when a first panel use condition is satisfied, so as to use the liquid crystal display panel as a current display panel; and turning on the organic light-emitting panel and turning off the liquid crystal display panel when a second panel use condition is satisfied, so as to use the organic light-emitting panel as a current display panel.

Optionally, the first panel use condition includes any of the following conditions:

detecting that a user-inputted operation instruction chooses to use a first panel, detecting that an intelligent terminal is in a moving mode or charging mode, detecting that a light intensity is not lower than a preset intensity threshold, and detecting that a length of a time period in which the intelligent terminal is in a standby state is greater than a preset time threshold.

Optionally, the second panel use condition includes any of the following conditions:

detecting that the user-inputted operation instruction chooses to use a second panel, and detecting that complexity of a user triggered event is greater than a preset complexity threshold.

In a third aspect, an embodiment also provides an electronic device, including the above display apparatus.

The present embodiment adopts the display apparatus composed of the organic light-emitting display panel and the liquid crystal display panel, capable of realizing time-sharing display in different application scenarios, and the upper and lower display panels of different types are not affected by each other. The wave plate is added between the display panels, such that both of the need of the backlight source and the need of improving display contrast are considered, thereby better satisfying user needs and improving user experience.

DETAILED DESCRIPTION

The present disclosure is further described in detail below in conjunction with drawings and embodiments. It can be understood that specific embodiments described herein are only used to explain the present disclosure, not to limit the present disclosure. It should also be noted that for ease of description, drawings only show parts of structures related to the present disclosure, not all of structures.

Embodiment 1

Figure 1:
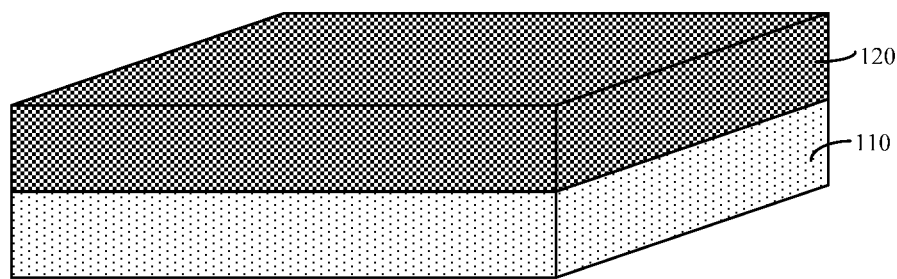
FIG. 1 is a structural schematic diagram illustrating a display apparatus according to an embodiment 1.

FIG. 1 is a structural schematic diagram illustrating a display apparatus provided in the embodiment 1. The display apparatus includes an organic light-emitting display panel 110 and a liquid crystal display panel 120 disposed on the organic light-emitting display panel 110.

In order to ensure that the organic light-emitting display panel 110 and the liquid crystal display panel 120 do not interfere with each other during time-sharing display, the liquid crystal display panel 120 is transparent and does not include a backlight source since the organic light-emitting display panel 110 below the liquid crystal display panel 120 may be shielded if the liquid crystal display panel 120 includes the backlight source. In addition, in order to enable the liquid crystal display panel 120 to normally display images, the organic light-emitting display panel 110 needs to provide the backlight source for the liquid crystal display panel 120. The organic light-emitting display panel 110 generally includes a metal layer as a metal cathode, the inventor proposes that the metal layer in the organic light-emitting display panel 110 is used as the backlight source for the liquid crystal display panel 120. Through the above ingenious design, time-sharing display of the two panels can be realized.

Optionally, the organic light-emitting display panel 110 and the liquid crystal display panel 120 can be combined through a bonding procedure to form the display apparatus.

The inventor finds through experiments that, the organic light-emitting display panel 110 has an operating current of 100 uA and an operating voltage of 3V, the liquid crystal display panel 120 has an operating current of 20 mA and an operating voltage of 3V. Using the liquid crystal display panel 120 to display contents which do not need color display, the power consumption can be reduced and electric quantity can be saved to a largest degree. For example, with respect to some intelligent terminals with small battery capacity and short cruising time (e.g., intelligent watches or intelligent bracelets), introduction of the above display apparatus can play a larger effect.

Generally, the liquid crystal display panel 120 is cheap. In a solution of the present embodiment, through the introduction of the liquid crystal display panel 120, power consumption of the display device can be greatly reduced without obvious increasing of the production cost, and the user experience and product competitiveness can be obviously improved.

Figure 2:
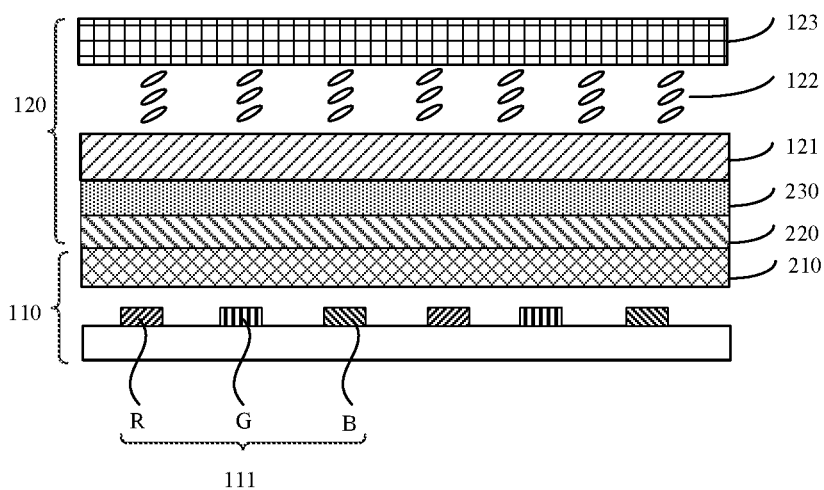
FIG. 2 is a structural schematic diagram illustrating another display apparatus according to the embodiment 1.

FIG. 2 is a structural schematic diagram illustrating another display apparatus provided in the present embodiment 1. The liquid crystal display panel 120 includes: a bottom substrate 121, a liquid crystal layer 122 and an upper substrate 123 which are stacked successively. The bottom substrate 121 is a transparent substrate. The bottom substrate 121 in the liquid crystal display panel 120 is close to a metal layer 210 in the organic light-emitting display panel 110, such that the metal layer 210 serves as a backlight source of the liquid crystal display panel 120. The liquid crystal display panel 120 also includes a linear polarizer 230 and a wave plate 220 located at one side of the bottom substrate 121 away from the liquid crystal layer 122, and the linear polarizer 230 is located between the bottom substrate 121 and the wave plate 220.

By referring to FIG. 2, the display apparatus provided in the present embodiment 1 may be configured to include: an organic light-emitting display panel 110 and a liquid crystal display panel 120 disposed on a light-emitting side of the organic light-emitting display panel 110.

The liquid crystal display panel 120 includes: a wave plate 220, a linear polarizer 230, a bottom substrate 121, a liquid crystal layer 122 and an upper substrate 123 which are stacked successively. The bottom substrate 121 is a transparent substrate.

The organic light-emitting display panel 110 includes a metal layer 210, and the metal layer 210 serves as a backlight source of the liquid crystal display panel 120.

The organic light-emitting display panel 110 may also include a substrate and a plurality of organic light-emitting structures 111 which are arranged at one side of the substrate in an array mode. The organic light-emitting structures 111 include red organic light-emitting structures R, green organic light-emitting structures G and blue organic light-emitting structures B. The red organic light-emitting structure R is configured to emit red light, the green organic light-emitting structure G is configured to emit green light, and the blue organic light-emitting structure B is configured to emit blue light.

OLED (also called an organic electroluminescence device) includes an anode, a cathode and a light-emitting layer that correspond to each pixel region. When a voltage is applied to the anode and the cathode, holes move to the light-emitting layer through a hole transporting layer, electrons move to the light-emitting layer through an electron transporting layer, the holes and the electrons are recombined in the light-emitting layer, and excitons in light-emitting layer material migrate from the excited state to the ground state, such that light is emitted. The light-emitting layers of the organic light-emitting structures emitting different color lights are made from different materials. The materials of light-emitting layers corresponding to the organic light-emitting structures emitting different color lights respectively emit different color lights under the effects of anode voltages and cathode voltages of the organic light-emitting structures.

Optionally, the organic light-emitting display panel 110 includes: an active-matrix organic light emitting diode (AMOLED). Exemplarily, the above liquid crystal display panel 120 includes a TN mode panel.

A foundation of the AMOLED is organic light-emitting cells. Thousands of cells that each can only emit one of red, green and blue are placed on a substrate of the substrate in a specific form. When voltages are applied to the light-emitting cells, the light-emitting cells emit red, green or blue. The voltage applying also needs to depend on a thin film transistor (TFT). After a ratio of the three primary colors is regulated, multiple colors can be presented.

In the present embodiment, the AMOLED may display contents in a color display mode. The liquid crystal display panel 120 may display contents in a black-white display mode. For example, if a user only wants to see time and date, the time and the date can be displayed by the liquid crystal display panel 120. If the user needs Wechat, Wechat can be displayed by the organic light-emitting display panel 110. The above time-sharing display form can save electric quantity to a larger degree.

Optionally, the wave plate 220 may be a ¼λ wave plate or a ½λ wave plate.

The ½λ wave plate is a ½ wave plate which is a birefringent crystal with a preset thickness. λ represents a wavelength. When normal incidence light passes through the ½λ wave plate, a phase difference between the ordinary light (o light) and the extraordinary light (e light) is equal to π or odd times of π. This crystal plate is called as the ½ wave plate, abbreviated as half-wave plate. The ¼λ wave plate is a ¼ wave plate which is a birefringent mono-crystal plate with a specific thickness and can be made of calcite material. When the normal incidence light passes through the ¼λ wave plate, a phase difference between the ordinary light (o light) and the extraordinary light (e light) is equal to π/2 or odd times of π/2. This crystal plate is called as the quarter-wave plate or ¼ wave plate. When a linearly polarized light is incident vertically to the ¼ wave plate, and the polarization of the linearly polarized light and an optical axis plane (vertical natural cranked surface) of mica form an angle of θ, the linearly polarized light becomes a elliptically polarized light after existing. When θ=45°, the existing light becomes a circularly polarized light. A basic principle of the circular polarizer is: an upper linear polarizer and a lower ¼λ wave plate. The incident natural light becomes a polarized light after passing through the linear polarizer, and a polarization direction of the incident light is changed after passing through the ¼λ wave plate. After the light is reflected by a surface of the light-emitting layer of the AMOLED, since there exists a phase difference between the reflected light and the polarization direction after linear polarization, most of light intensity is absorbed by the linear polarizer and cannot be reflected out. In this way, the circular polarizer filters out stray light reflected by the surface of the AMOLED, thereby improving the contrast of the reflection of the AMOLED. Therefore, generally, an upper end of the metal layer of the AMOLED may be covered with a circular polarizer, so as to improve the contrast. However, the display apparatus provided in the present embodiment is a dual-panel screen. The TN panel in the dual-panel screen needs to use the light reflected by the surface of the light-emitting layer of the AMOLED as the backlight source for display. Therefore, the circular polarizer shall be removed.

Multiple mature AMOLED products have appeared in a relevant technology. In these products, in order to filter out unwanted light waves and increase the display contrast of the AMOLED, a circular polarizer is generally bonded to an upper part of the metal layer in the AMOLED. Therefore, to reduce implementation procedures of the present embodiment and save development cost, in the present embodiment, the circular polarizer in the existing AMOLED products can be omitted, such that the existing AMOLED product with the circular polarizer being removed can be directly used as the organic light-emitting display panel 110 in the present embodiment.

Exemplarily, this need may be proposed directly at the time of purchasing AMOLED panels produced by other manufacturers, so that the manufacturers reduce the procedure of bonding the circular polarizer in a production process of the AMOLED panel. Thus, the AMOLED panel without the circular polarizer is directly obtained, i.e., the organic light-emitting display panel 110 is directly obtained. Then, the purchased AMOLED panel is used to conduct subsequent bonding procedure with the TN panel and the like.

However, if the circular polarizer is removed, a display effect may be affected and the contrast may be decreased. Since the TN panel has an upper linear polarizer and a lower linear polarizer, a wave plate (which may be the ¼λ wave plate or the ½λ wave plate) can be bonded to a lower part of the lower linear polarizer. The angle is regulated so that the linear polarizers and the wave plate form an elliptical polarizer. Optionally, the ¼λ wave plate includes an ordinary optical axis and an extraordinary optical axis which are perpendicular to each other; and an included angle θ between a polarization direction of the linearly polarized light and the ordinary optical axis of the ¼λ wave plate satisfies 25°<θ<40°. Optionally, the included angle θ is 37°. Thus, the polarized light that is incident to the surface of the AMOLED is not completely absorbed by the linear polarizer, and a certain proportion (which is almost 50% when the included angle θ is 37°) of the reflected light can pass through the linear polarizer as the backlight source when the TN panel is used for displaying images. Meanwhile, another part of the reflected light is absorbed by the linear polarizer. The need of the backlight source and the need of improvement of the display contrast are simultaneously considered, thereby better satisfying user needs and improving user experience.

The inventor finds through experiments that, under a specific condition, the operating current of the organic light-emitting display panel 110 is 100 uA, the operating voltage of the organic light-emitting display panel 110 is 3V, the operating current of the liquid crystal display panel 120 is 20 mA, and the operating voltage of the liquid crystal display panel 120 is 3V. Using the liquid crystal display panel 120 to display contents which do not need color display, the power consumption can be reduced and electric quantity can be saved to a largest degree. For example, with respect to some intelligent terminals with small battery capacity and short endurance time (e.g., intelligent watches or intelligent bracelets), introduction of the above display apparatus can play a larger effect.

Generally, the liquid crystal display panel 120 is cheap. In the solution of the present embodiment, through the introduction of the liquid crystal display panel 120, the power consumption of the display apparatus can be greatly reduced without obvious increasing of the production cost, and the user experience and product competitiveness can be obviously improved.

Figure 3:
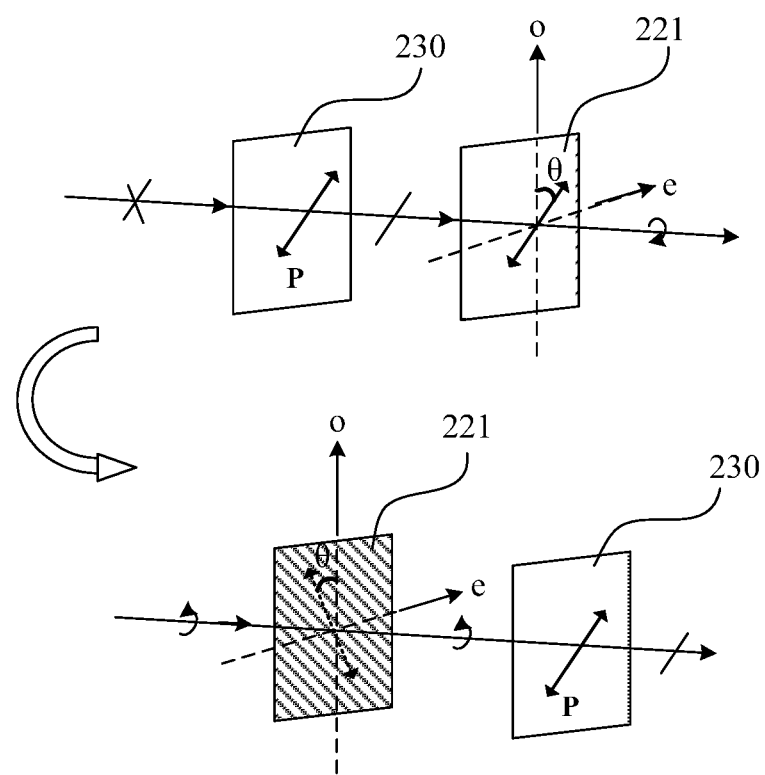
FIG. 3 is a diagram illustrating a light propagation path according to the embodiment 1.

FIG. 3 is a diagram illustrating a light propagation path provided in the present embodiment 1. In FIG. 3, an arrow direction represents a light propagation direction.

By taking the ¼λ wave plate made of the calcite material as an example, how the elliptical polarizer not only ensures the OLED panel and provides the backlight source but also prevents the glare to a certain degree is described simply below. The description is given by taking the included angle θ between the polarization direction of the linearly polarized light and the ordinary optical axis of the ¼λ wave plate 221 of 37° as an example. Through observation towards a light propagation direction in the present embodiment, when a beam of unpolarized light (e.g., sun light) enters the display panel, the unpolarized light firstly passes through the linear polarizer 230 and then becomes linearly polarized light with the polarization direction perpendicular to the direction of a transmission axis p. Then, the linearly polarized light passes through the ¼λ wave plate 221 and becomes right-handed elliptically polarized light, the right-handed elliptically polarized light is reflected by the metal layer of the OLED, and then passes through the ¼λ wave plate 221 and the linear polarizer 230 again. Through observation towards the light propagation direction, the right-handed elliptically polarized light becomes left-handed elliptically polarized light. The right-handed elliptically polarized light firstly passes through the ¼λ wave plate 221 and still is the left-handed elliptically polarized light, the linearly polarized light with the polarization direction identical with that of the transmission axis p is absorbed by the linear polarizer 230, and another part of light exits the OLED as the backlight source of the TN panel.

Optionally, the wave plate is bonded with the linear polarizer through a liquid optical adhesive.

A crystal film can be directly bonded to the outer surface of the liquid crystal display panel through the liquid optical adhesive without changing the structure of the liquid crystal display panel, thereby realizing simplicity and convenience.

The organic light-emitting display panel includes a substrate and a plurality of organic light-emitting structures which are arranged at one side of the substrate in an array mode. The organic light-emitting structures include red organic light-emitting structures, green organic light-emitting structures and blue organic light-emitting structures. The red organic light-emitting structure is configured to emit red light, the green organic light-emitting structure is configured to emit green light, and the blue organic light-emitting structure is configured to emit blue light.

The liquid crystal display panel includes a film-compensated super twisted nematic (FSTN) display panel.

Optionally, the upper substrate includes an upper polarizer and a compensation film which is located at one side of the upper polarizer facing away from the lower polarizer. The compensation film is configured to improve color shift and realize black-white display. The liquid crystal display panel is used for displaying the currently presented contents in a black-white display mode. The compensation film has birefringence.

Figure 4:
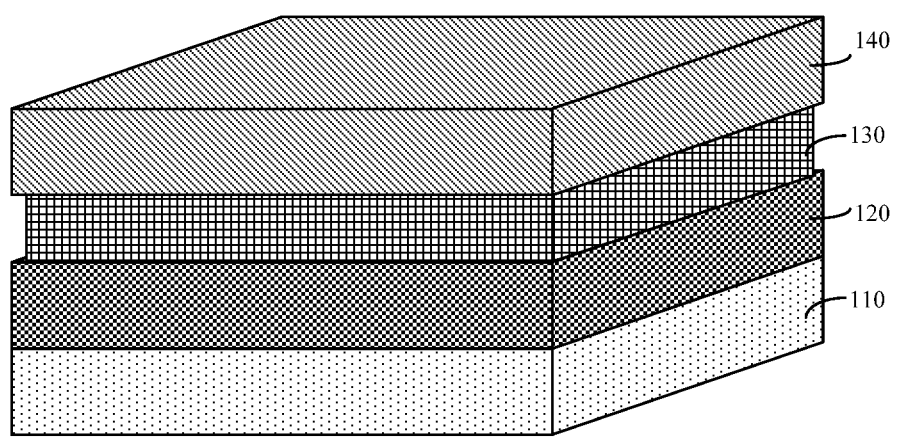
FIG. 4 is a structural schematic diagram illustrating another display apparatus according to the embodiment 1.

FIG. 4 is a structural schematic diagram illustrating another display apparatus provided in the present embodiment 1. The display apparatus further includes a touch functional layer 130. The touch functional layer 130 is located at one side of the liquid crystal display panel 120 facing away from the organic light-emitting display panel 110 to realize detection of a touch position. The display apparatus also includes a protecting cover plate 140 located at one side of the touch functional layer 130 facing away from the liquid crystal display panel 120.

In practical application, the liquid crystal display panel 120 needs a backlight source. A common backlight source adopts a full-reflecting lower polarizer, a semi-reflecting semi-transmitting lower polarizer or a backlight module including LEDs. Since the material of the backlight module may be non-transparent plastic material, the organic light-emitting display panel 110 below the liquid crystal display panel 120 is shielded, and the user cannot see the contents displayed on the organic light-emitting display panel 110.

Therefore, the metal layer 210 in the present embodiment may be a cathode, and the metal layer may be made of silver-magnesium alloy and has a transflective property. The metal layer 210 in the organic light-emitting display panel 110 is used as the backlight source of the liquid crystal display panel 120, namely, the ambient light reflected by the metal layer 210 provides a light source for the liquid crystal display panel 120.

The metal layer 210 of an ordinary AMOLED needs to be bonded with a polarizer. Stray light is filtered out through the polarizer, thereby increasing the display contrast. However, in the present embodiment, the metal layer of the AMOLED is not bonded with a polarizer, and the metal layer 210 is directly bonded with the liquid crystal display panel 120 and used as the backlight source of the liquid crystal display panel 120. The metal layer 210 is used as the backlight source of the liquid crystal display panel 120, not only providing a backlight source for the liquid crystal display panel 120 but also improving the display brightness of the organic light-emitting display panel 110. The decrease of the display contrast (black is not black enough) and the color saturation of the organic light-emitting display panel 110 caused by lack of the polarizer bonded to the metal layer 210 can be compensated through software regulation.

The present embodiment does not limit the relative positions of the compensation film and the upper polarizer. For example, the compensation film can be arranged at one side of the upper polarizer facing away from the lower polarizer, and can also be arranged at one side of the upper polarizer close to the lower polarizer. The compensation film may include one or more layers, which is not limited in the present embodiment.

Figure 5:
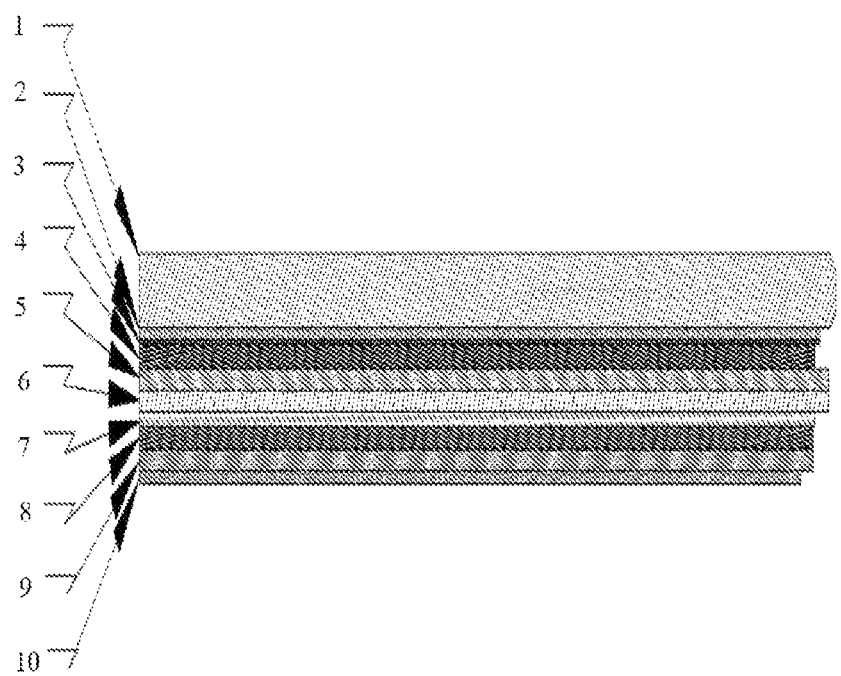
FIG. 5 is a schematic diagram illustrating layers of a display apparatus according to the embodiment 1.
Figure 6:
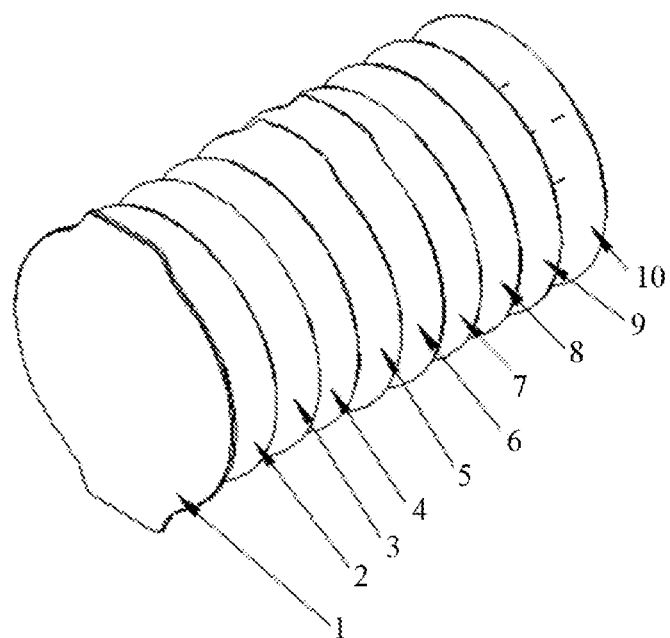
FIG. 6 is an exploded view illustrating a display apparatus according to the embodiment 1.

FIG. 5 is a schematic diagram illustrating layers of a display apparatus provided in the present embodiment 1. FIG. 6 is an exploded view illustrating a display apparatus provided in the present embodiment 1. The display apparatus includes a cover plate 1, a transparent adhesive 2, a touch-sensitive sheet 3, a TN panel upper polarizer 4, a TN screen panel glass 5, a TN panel lower glass 6, a TN panel lower polarizer 7, an OLED panel upper glass 8, an OLED panel lower glass 9 and an OLED buffer foam 10 which are stacked successively.

In the present embodiment, the display apparatus is composed of the organic light-emitting display panel and the liquid crystal display panel, can realizing time-sharing display in different application scenarios, and the upper and lower display panels of different types are not affected by each other. The wave plate is added between the display panels, both the need of the backlight source and the need of improving display contrast are also considered, thereby better satisfying user needs and improving user experience.

Embodiment 2

Figure 7:
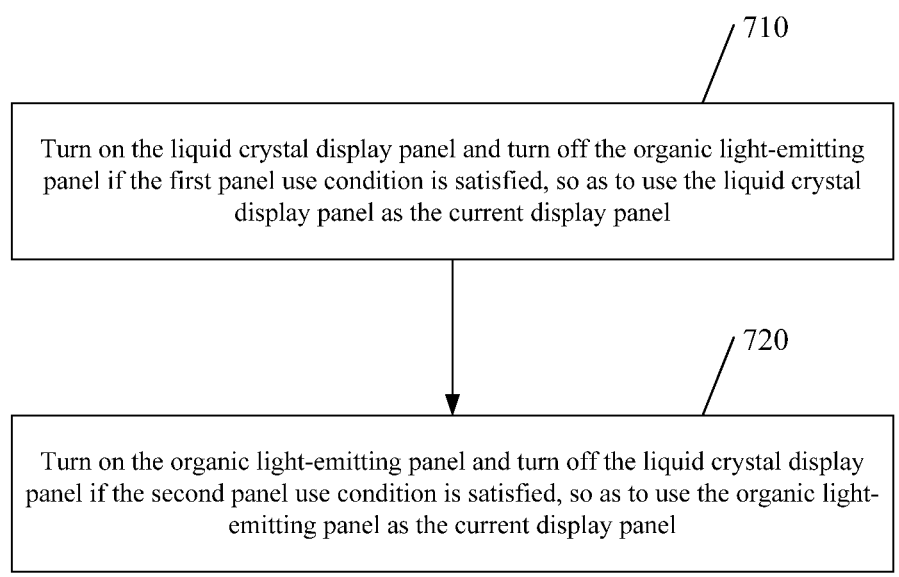
FIG. 7 is a flow chart of a panel switching method according to an embodiment 2.

FIG. 7 is a flow chart of a panel switching method provided in the present embodiment 2. The method is used to conduct switching control over any of the display apparatuses provided in the present embodiment. The method is executed by a panel switching system. The system is executed by at least one of software and hardware, and can be integrated in various electronic devices (e.g., intelligent watches or intelligent mobile phones) including the display apparatus. The method includes: step 710-step 720.

In the step 710, when a first panel use condition is satisfied, the liquid crystal display panel is turned on and the organic light-emitting panel is turned off so as to use the liquid crystal display panel as a current display panel.

In the step 720, when a second panel use condition is satisfied, the organic light-emitting panel is turned on and the liquid crystal display panel is turned off so as to use the organic light-emitting panel as a current display panel.

In the display apparatus to which the method in the present embodiment is applied, the liquid crystal display panel further includes a linear polarizer and a wave plate located at one side of the bottom substrate away from the liquid crystal layer, and the linear polarizer is located between the bottom substrate and the wave plate.

The panel switching method in the present embodiment can be applied to the display apparatus provided in the present embodiment. The display apparatus may be a double-panel screen composed of the liquid crystal display panel and the organic light-emitting panel. The double-panel screen can be applied to the intelligent terminal, can be applied to intelligent watches or intelligent bracelets or other intelligent wearable devices, can also be applied to tablet personal computers or mobile phones or other mobile terminals, and can also be applied to other terminals with display need. Many devices employ the organic display panel as a display screen. An organic light-emitting diode is widely applied to the intelligent terminals for light weight and good colored display effect. For example, for the wearable devices, OLED display screen is a better choice. However, if only OLED is used as the display screen, a problem may exist, i.e., system power consumption is increased. In a use process of the intelligent terminals, only a small quantity of information is displayed in some application scenarios. Exemplarily, when the user wears a wearable device to participate in outdoor activities. it is possible that only time, dates or step number and other related contents need to be displayed and other information does not need to be displayed. If the OLED is continuously operating for display, unnecessary power consumption is generated. If the wearable device cannot be charged timely, the use of the wearable device by the user may be affected. In view of this problem, the present embodiment adopts a double-panel screen composed of the liquid crystal display panel and the organic light-emitting panel. A TN panel is disposed above the OLED panel. Since the cost of the TN panel is low, the double-panel screen has high cost performance. Optionally, the FSTN display panel (i.e., the FSTN liquid crystal panel) and the AMOLED (i.e., the AMOLED panel) can be adopted. The AMOLED has self-illumination property, certain flexibility, wide color gamut and thinness, and has special advantages when applied to the wearable device.

The user can choose the display panel for display according to own needs, and the system can also switch the display panel according to actual situations. If the first panel use condition is satisfied, the liquid crystal display panel is turned on and the organic light-emitting panel is turned off so as to use the liquid crystal display panel as the current display panel. If the second panel use condition is satisfied, the organic light-emitting panel is turned on and the liquid crystal display panel is turned off so as to use the organic light-emitting panel as the current display panel. The intelligent terminal can judge whether the first panel use condition or the second panel use condition is satisfied. The above two steps have no sequential relationship, and the execution order of the two steps is not limited herein. When the first panel use condition is satisfied, it indicates that the use need of the first panel is present.

Since the power consumption can be reduced if the liquid crystal display panel is adopted for display, the liquid crystal display panel can be selected when the user does not need to display too many contents. Optionally, the first panel use condition includes any of the following conditions: detecting that a user-inputted operation instruction chooses to use a first panel, detecting that an intelligent terminal is in a moving mode or charging mode, detecting that light intensity is not lower than a preset intensity threshold, and detecting that the intelligent terminal is in a standby state for a time period greater than a preset time threshold. The second panel use condition includes any of the following conditions: detecting that the user-inputted operation instruction chooses to use a second panel and detecting that complexity of a user triggered event is greater than a preset complexity threshold. The user-inputted operation may be a user-inputted spatial gesture (e.g., lifting a wrist or rocking an arm), and different definitions can be made for different times of spatial gesture. For example, if the user rocks the arm for one time, it indicates that the user wants to choose the liquid crystal display panel as the display screen, and if the user rocks the arm two times continuously, it indicates that the user wants to choose the organic display panel as the display screen. The user can also input instructions through mechanical buttons on the intelligent terminal. Exemplarily, the user can input the instructions through a crown of the intelligent watch, and can also switch the screen according to a mode of the intelligent terminal. For example, when the intelligent terminal is in the moving mode or the charging mode, the user has no need of viewing application software and the like and can switch to the liquid crystal display panel for display. The intelligent terminal may be provided with a near field communication (NFC) chip, and can be used to replace a metro card, a bus card or a bank card and the like. When the intelligent terminal is used to swipe card rapidly, the intelligent terminal only needs to be close to a card reader or a turnstile. If the user has no viewing need, the user can choose the liquid crystal display panel for display.

After the intelligent terminal is in a standby state for a specific time, it can also be determined that the user has no need of conducting complex operation on the intelligent terminal at present, and the liquid crystal display panel can be selected to achieve an energy saving effect. In addition, the TN display panel has the following characteristics: as the light intensity is increased, the display contrast of a picture is also increased. Namely, in the black-white display mode, the displayed picture is more clear. However, when the intensity of ambient light of the OLED screen is high, the brightness of the screen shall be adjusted to a large value, thereby generating a high power consumption. Therefore, when the light intensity is high, the TN panel is used for display images. The first panel use condition may be that the light intensity is greater than a preset light intensity threshold. The preset light intensity threshold can be adjusted according to the property of the display panel, and can also be set according to actual needs. The second panel use condition may be that the complexity of the user triggered event is greater than a preset complexity threshold. The complexities of all user triggered events that may be generated can be assessed in advance. The complexities are determined according to the complexities of pictures to be displayed. The user triggered events may be viewing time, listening to music or radio, starting an application program and the like. The events of "viewing time", "viewing weather" and the like can be defined as events with low complexity; and the event of "starting an application program" can be defined as an event with high complexity. When the complexity of the event exceeds the preset complexity threshold, it indicates that the event has a high display need. For example, when the user uses the intelligent terminal to start an application program of Alipay for making payment or the user chats through Wechat, it is needed to use the OLED panel for displaying images.

In the panel switching method provided in the present embodiment, two display panels in the double-panel screen are switched according to different conditions, thereby ensuring actual display needs and achieving effects of saving energy and reducing power consumption. The display panels can also be selected according to user willing, thereby promoting user experience, enabling the product to be closer to the actual needs of the user and facilitating product popularization.

Embodiment 3

Figure 8:
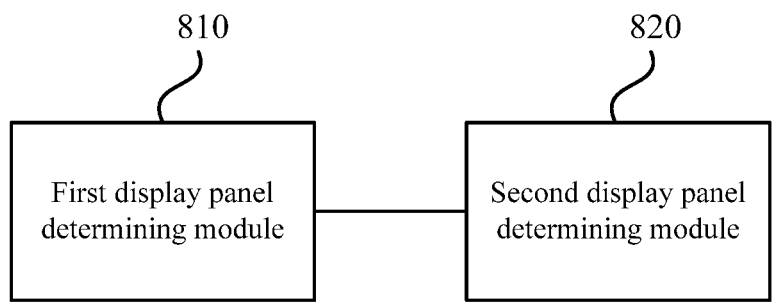
FIG. 8 is a structural schematic diagram illustrating a panel switching system according to an embodiment 3.

FIG. 8 is a structural schematic diagram illustrating a panel switching system provided in the present embodiment 3. The system can be realized by software and/or hardware, and can execute the panel switching method provided in any embodiment. The system includes:

a first display screen determining module 810 configured to turn on the liquid crystal display panel and turn off the organic light-emitting panel if the first panel use condition is satisfied, so as to use the liquid crystal display panel as the current display panel; and a second display screen determining module 820 configured to turn on the organic light-emitting panel and turn off the liquid crystal display panel if the second panel use condition is satisfied, so as to use the organic light-emitting panel as the current display panel.

Optionally, the first panel use condition includes any of the following conditions:

detecting that a user-inputted operation instruction chooses to use the first panel, detecting that an intelligent terminal is in a moving mode or charging mode, detecting that light intensity is not lower than a preset intensity threshold, and detecting that the intelligent terminal is in a standby state for a time period greater than a preset time threshold.

The second panel use condition includes any of the following conditions:

detecting that the user-inputted operation instruction chooses to use the second panel and detecting that complexity of a user triggered event is greater than the preset complexity threshold.

In the display apparatus to which the method in the present embodiment is applied, the liquid crystal display panel further includes a linear polarizer and a wave plate located at one side of the bottom substrate facing away from the liquid crystal layer, and the linear polarizer is located between the bottom substrate and the wave plate.

The above panel switching system can execute the panel switching method provided by any embodiment, and has a functional module for executing the panel switching method and beneficial effects.

Embodiment 4

Figure 9:
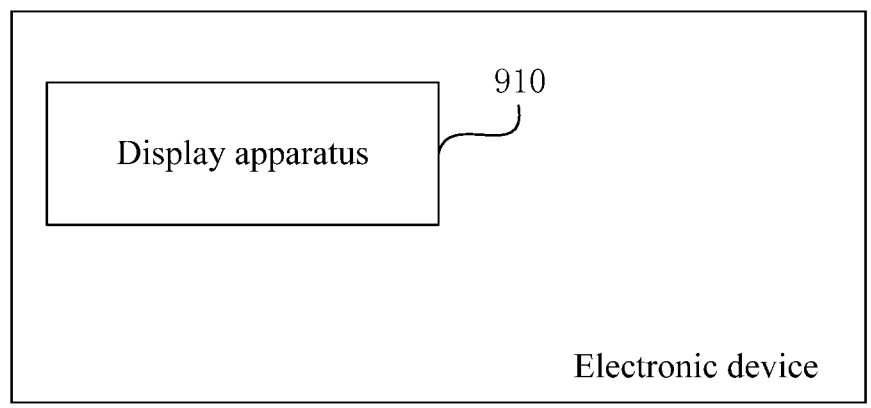
FIG. 9 is a structural schematic diagram illustrating an electronic device according to an embodiment 4.

FIG. 9 is a structural diagram illustrating an electronic device provided in the present embodiment 4. As shown in FIG. 9, the electronic device includes the display apparatus 910 in any of above embodiments.

Embodiment 5

Figure 10:
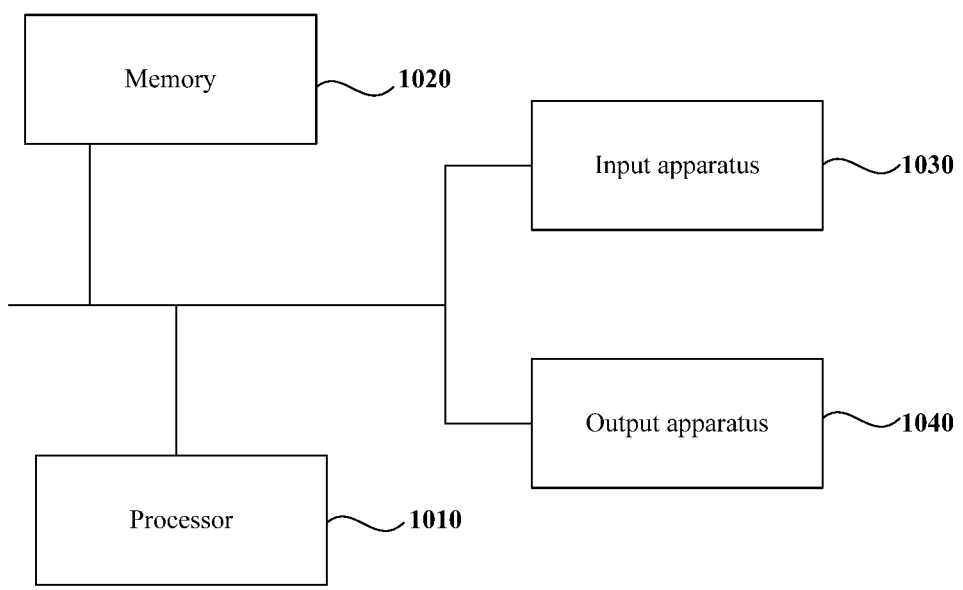
FIG. 10 is a structural schematic diagram illustrating the hardware configuration of an electronic device according to an embodiment 5.

FIG. 10 is a schematic diagram illustrating the hardware configuration of an electronic device provided in the present embodiment 5. As shown in FIG. 10, the device includes:

one or more processors 1010, where in FIG. 10, one processor 1010 is taken as an example; and a memory 1020.

The device may further include: an input apparatus 1030 and an output apparatus 1040.

The processor 1010, the memory 1020, the input apparatus 1030 and the output apparatus 1040 in the device can be connected by a bus or in other manners, and connecting by the bus is taken as an example in FIG. 10.

As a non-transitory computer readable storage medium, the memory 1020 may be used for storing software programs, computer executable programs and modules, such as program instructions/modules (e.g., the first display screen determining module 810 and the second display screen determining module 820 shown in FIG. 8) corresponding to the panel switching method in embodiments of the present application. The processor 1010 executes various function applications and data processing of the panel switching system by operating the software programs, the instructions and the modules stored in the memory 1020, thereby realizing the panel switching method in above method embodiments.

The memory 1020 may include a program storage region and a data storage region. The program storage region can store an operating system and application programs required for at least one function, and the data storage region may store data and the like created according to use of the electronic device. In addition, the memory 1020 may include a high-speed random access memory, and may further include a non-transitory memory, such as at least one of a disk memory device, a flash memory device or other non-transitory solid-state memory devices. In some embodiments, the memory 1020 may include memories remotely arranged relative to the processor 1010. These remote memories may be connected to the terminal device by a network. An example of the above network includes but not limited to Internet, Intranet, local area network, mobile communication network and a combination thereof.

The input apparatus 1030 may be used for receiving input digit or character information, and producing key signal input related to user setting and function control of the electronic device. The output apparatus 1040 may include a display screen and other display devices.

Embodiment 6

The present embodiment 6 provides a computer readable storage medium storing a computer program. The program realizes the panel switching method provided by all embodiments of the present application when executed by the processor. The method includes:

if the first panel use condition is satisfied, the liquid crystal display panel is turned on and the organic light-emitting panel is turned off so as to use the liquid crystal display panel as the current display panel; and if the second panel use condition is satisfied, the organic light-emitting panel is turned on and the liquid crystal display panel is turned off so as to use the organic light-emitting panel as the current display panel.

One computer readable medium or any combination of multiple computer readable media can be adopted. The computer readable medium may be a computer readable signal medium or a computer readable storage medium. The computer readable storage medium, for example, may be but not limited to electrical, magnetic, optical, electromagnetic, infrared or semiconductor system, apparatus or device or any combination thereof. Examples (non-exhaustive list) of the computer readable storage medium include: electrical connection of one or more wires, a portable computer disk, a hard disk, a random access memory (RAM), a read-only memory (ROM), an electrically programmable read-only-memory (EPROM or flash memory), an optical fiber, a compact disc read-only memory (CD-ROM), an optical storage device, a magnetic storage device or any proper combination thereof. In the present disclosure, the computer readable storage medium may be any tangible medium that includes or stores programs. The programs can be used by or combined with an instruction executing system, apparatus or device for use.

The computer readable signal medium may include a data signal which is transmitted in a base band or as part of a carrier wave, and carries computer readable program codes. The transmitted data signal may be in many forms, including but not limited to an electromagnetic signal, an optical signal or any proper combination thereof. The computer readable signal medium may also be any computer readable medium other than the computer readable storage medium. The computer readable medium may send, transmit, or transfer programs used by or combined with the instruction executing system, apparatus or device for use.

The program codes on the computer readable medium can be transmitted with any proper medium, including but not limited to a wireless medium, a wire, a cable, an RF and the like or any proper combination thereof.

The computer program codes used to perform this operation can be written in one or more programming languages or combinations thereof. The programming languages include object-oriented programming languages (such as Java, Smalltalk and C++), and also include conventional procedural programming languages (such as "C" language or similar programming languages). The program codes can be fully executed on a user computer, partially executed on the user computer, executed as an independent software package, partially executed on the user computer and partially executed on a remote computer, or fully executed on the remote computer or a server. If the remote computer is involved, the remote computer can be connected to the user computer through any kind of network including LAN or WAN, or can be connected to an external computer (e.g., connected through Internet using an Internet service provider).

It should be noted that the above only describes optional embodiments and applied technical principles of the present disclosure. It shall be understood by those skilled in the art that, the present disclosure is not limited to specific embodiments described herein. Those skilled in the art can make various apparent changes, readjustments and replacements without departing from a protection scope of the present disclosure. Therefore, although the present disclosure is described in detail through above embodiments, the present disclosure is not limited to above embodiments and may further include more other equivalent embodiments without departing from concepts of the present disclosure, while the scope of the present disclosure is decided by a scope of attached claims.

INDUSTRIAL APPLICABILITY

The display apparatus provided in the present disclosure can greatly decrease the power consumption of the configured device without increasing a large production cost, and can bring obvious improvement of user experience and product competitiveness.

What is claimed is:

1. A display apparatus, comprising: an organic light-emitting display panel and a liquid crystal display panel disposed on a light-emitting side of the organic light-emitting display panel,
   wherein the liquid crystal display panel comprises: a wave plate, a linear polarizer, a bottom substrate, a liquid crystal layer and an upper substrate which are stacked successively, and the bottom substrate is a transparent substrate; and
   wherein the organic light-emitting display panel comprises a metal layer, and the metal layer serves as a backlight source for the liquid crystal display panel;
   wherein the wave plate is a ¼ λ wave plate;
   wherein the ¼ λ wave plate comprises an ordinary optical axis and an extraordinary optical axis which are perpendicular to each other, and an included angle θ between a polarization direction of a linearly polarized light and the ordinary optical axis of the ¼ λ wave plate satisfies 25°<θ<40°.

2. The display apparatus according to claim 1, wherein the included angle θ is 37°.

3. The display apparatus according to claim 1, wherein the wave plate is bonded with the linear polarizer through a liquid optical adhesive.

4. The display apparatus according to claim 1, wherein the organic light-emitting display panel further comprises a substrate and a plurality of organic light-emitting structures which are arranged at one side of the substrate and arranged in an array; and
   the organic light-emitting structures comprise a red organic light-emitting structure, a green organic light-emitting structure and a blue organic light-emitting structure; the red organic light-emitting structure is configured to emit red light; the green organic light-emitting structure is configured to emit green light; and the blue organic light-emitting structure is configured to emit blue light.

5. The display apparatus according to claim 1, wherein the liquid crystal display panel comprises a film-compensated super twisted nematic display panel.

6. A panel switching method, for a switching control of the display apparatus of claim 1, comprising:
   turning on the liquid crystal display panel and turning off the organic light-emitting panel when a first panel use condition is satisfied, so as to use the liquid crystal display panel as a current display panel; and
   turning on the organic light-emitting panel and turning off the liquid crystal display panel when a second panel use condition is satisfied, so as to use the organic light-emitting panel as a current display panel.

7. The method according to claim 6, wherein the first panel use condition comprises any of the following conditions:
   detecting that a user-inputted operation instruction chooses to use a first panel,
   detecting that an intelligent terminal is in a moving mode or charging mode,
   detecting that a light intensity is not lower than a preset intensity threshold, and
   detecting that a length of a time period in which the intelligent terminal is in a standby state is greater than a preset time threshold.

8. The method according to claim 6, wherein the second panel use condition comprises any of the following conditions:
   detecting that the user-inputted operation instruction chooses to use a second panel, and detecting that complexity of a user triggered event is greater than a preset complexity threshold.

9. An electronic device, comprising a display apparatus, wherein the display apparatus comprises: an organic light-emitting display panel and a liquid crystal display panel disposed on a light-emitting side of the organic light-emitting display panel, wherein the liquid crystal display panel comprises: a wave plate, a linear polarizer, a bottom substrate, a liquid crystal layer and an upper substrate which are stacked successively, and the bottom substrate is a transparent substrate; and wherein the organic light-emitting display panel comprises a metal layer, and the metal layer serves as a backlight source for the liquid crystal display panel;

wherein the wave plate is a ¼ λ wave plate;

wherein the ¼ λ wave plate comprises an ordinary optical axis and an extraordinary optical axis which are perpendicular to each other, and an included angle θ between a polarization direction of a linearly polarized light and the ordinary optical axis of the ¼ λ wave plate satisfies 25°<θ<40°.

10. The method according to claim 7, wherein the second panel use condition comprises any of the following conditions:

detecting that the user-inputted operation instruction chooses to use a second panel, and detecting that complexity of a user triggered event is greater than a preset complexity threshold.

11. The electronic device according to claim 9, wherein the included angle θ is 37°.

12. The electronic device according to claim 9, wherein the wave plate is bonded with the linear polarizer through a liquid optical adhesive.

13. The electronic device according to claim 9, wherein the organic light-emitting display panel further comprises a substrate and a plurality of organic light-emitting structures which are arranged at one side of the substrate and arranged in an array; and the organic light-emitting structures comprise a red organic light-emitting structure, a green organic light-emitting structure and a blue organic light-emitting structure; the red organic light-emitting structure is configured to emit red light; the green organic light-emitting structure is configured to emit green light; and the blue organic light-emitting structure is configured to emit blue light.

14. The electronic device according to claim 9, wherein the liquid crystal display panel comprises a film-compensated super twisted nematic display panel.

* * * * *